(12) United States Patent
Wang et al.

(10) Patent No.: US 11,387,104 B2
(45) Date of Patent: *Jul. 12, 2022

(54) GRAFTING DESIGN FOR PATTERN POST-TREATMENT IN SEMICONDUCTOR MANUFACTURING

(71) Applicant: Taiwan Semiconductor Manufacturing Co., Ltd., Hsin-Chu (TW)

(72) Inventors: Siao-Shan Wang, Hsinchu (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/889,506

(22) Filed: Jun. 1, 2020

(65) Prior Publication Data

US 2020/0294801 A1 Sep. 17, 2020

Related U.S. Application Data

(63) Continuation of application No. 15/600,037, filed on May 19, 2017, now Pat. No. 10,672,610.

(51) Int. Cl.
*H01L 21/033* (2006.01)
*H01L 21/027* (2006.01)
*G03F 7/40* (2006.01)

(52) U.S. Cl.
CPC ............ *H01L 21/0332* (2013.01); *G03F 7/40* (2013.01); *H01L 21/0273* (2013.01)

(58) Field of Classification Search
CPC .... H01L 21/0332; H01L 21/0273; G03F 7/40
See application file for complete search history.

(56) References Cited

U.S. PATENT DOCUMENTS

| 6,486,058 | B1 * | 11/2002 | Chun ........................ G03F 7/40 |
| | | | 257/E21.026 |
| 8,039,195 | B2 | 10/2011 | Shih et al. |
| 8,796,666 | B1 | 8/2014 | Huang et al. |
| 9,012,132 | B2 | 4/2015 | Chang |

(Continued)

FOREIGN PATENT DOCUMENTS

| CN | 102066509 A | 5/2011 |
| TW | 201214029 A | 4/2012 |
| TW | 201629643 A | 8/2016 |

*Primary Examiner* — James M Mellott
(74) *Attorney, Agent, or Firm* — Haynes and Boone, LLP

(57) ABSTRACT

A method for lithography patterning includes forming an opening in a first layer over a substrate and coating a grafting solution over the first layer and filling in the opening. The grafting solution comprises a grafting compound and a solvent. The grafting compound comprises a grafting unit chemically bonded to a linking unit chemically bonded to a polymer backbone. The grafting unit is attachable to the first layer. The method further includes curing the grafting solution so that a first portion of the grafting compound is attached to a surface of the first layer, thereby forming a second layer over the surface of the first layer. The method further includes transferring a pattern including the first layer and the second layer to the substrate.

20 Claims, 4 Drawing Sheets

(56) References Cited

U.S. PATENT DOCUMENTS

| | | |
|---|---|---|
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 10,672,610 B2 * | 6/2020 | Wang ................ H01L 21/0273 |
| 2005/0255696 A1 * | 11/2005 | Makiyama ........ H01L 21/28114 |
| | | 438/637 |
| 2015/0086929 A1 * | 3/2015 | Hatakeyama ............ C08K 5/06 |
| | | 430/324 |
| 2015/0338744 A1 | 11/2015 | Hatakeyama et al. |
| 2016/0124312 A1 | 5/2016 | Hatakeyama et al. |
| 2016/0266495 A1 * | 9/2016 | Hirano ................ G03F 7/0045 |

\* cited by examiner

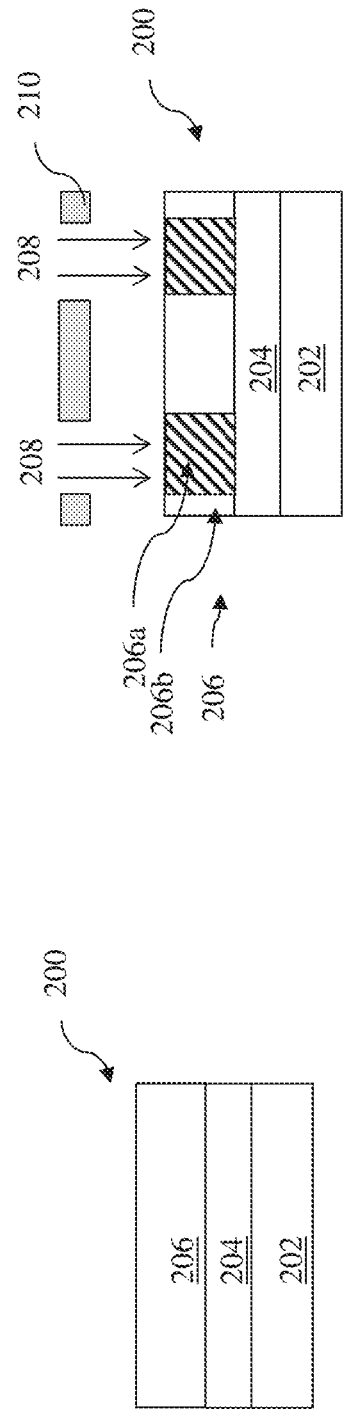
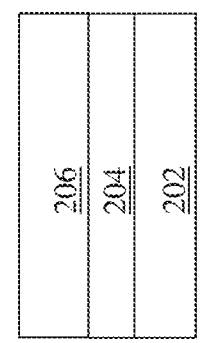

GRAFTING DESIGN FOR PATTERN POST-TREATMENT IN SEMICONDUCTOR MANUFACTURING

PRIORITY

This is a continuation application of U.S. patent application Ser. No. 15/600,037, filed May 19, 2017, the entire disclosure of which is herein incorporated by reference.

BACKGROUND

Photolithography has been used for patterning a substrate (e.g., a wafer) in order to form various features of an integrated circuit (IC). In a typical photolithography process, a photoresist (or resist) layer is formed over a substrate and is exposed to a radiation to form latent images of an IC. Subsequently, it is developed in a developer (a chemical solution) to remove portions of the resist layer, thereby forming a resist pattern. The resist pattern is then used as an etch mask in subsequent etching processes, transferring the pattern to an underlying material layer. The critical dimension of the resist pattern is generally limited by the photolithography process, such as the optical wavelength used for exposing the resist layer. To create patterns that are smaller than the optical resolution of a photolithography process, new materials and new processes are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E-1, 2E-2, 2F, 2G, 2H, 2I, and 2J illustrate cross-sectional views of forming a target pattern according to the method of FIG. 1, in accordance with an embodiment.

DETAILED DESCRIPTION

Figure 1:
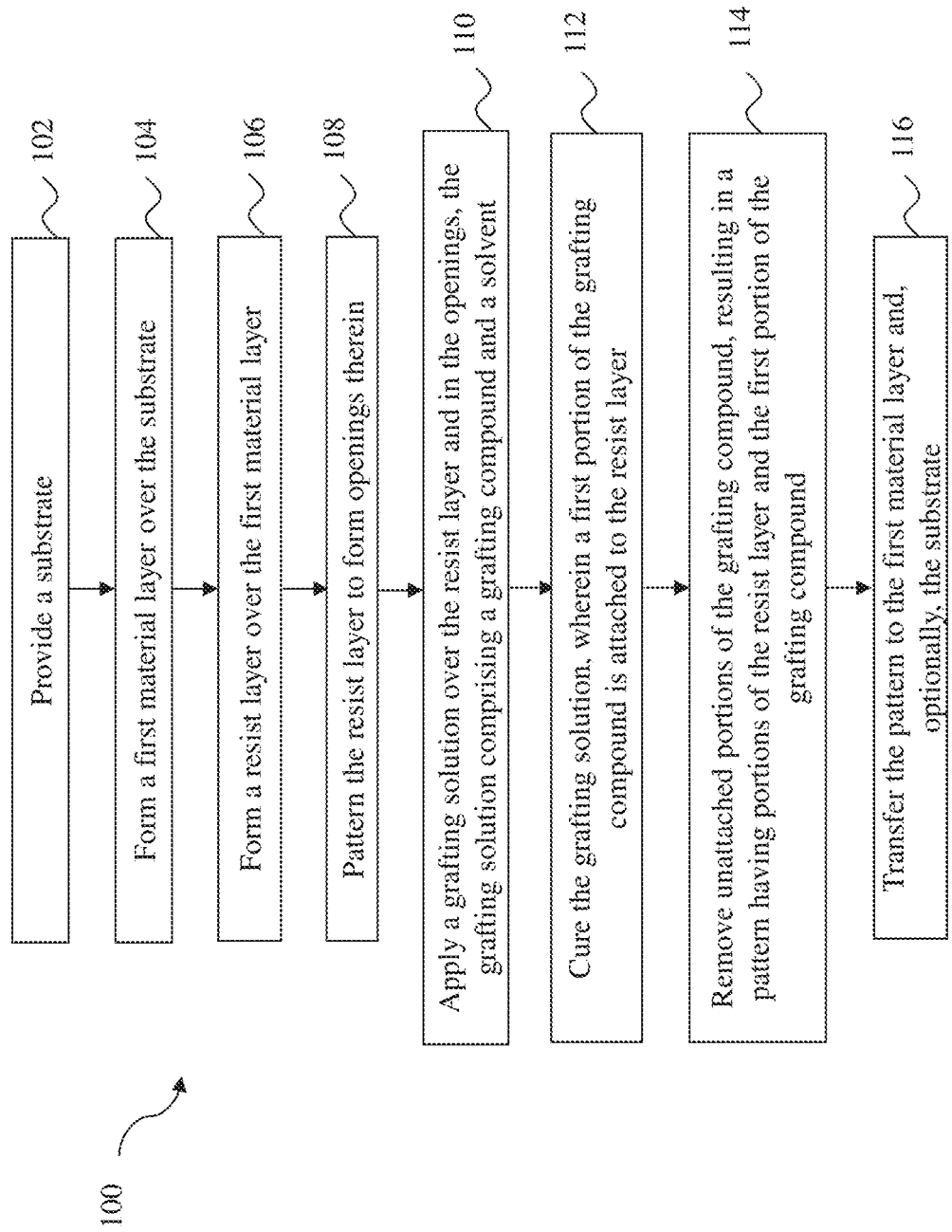
FIG. 1 illustrates a flow chart of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to using a new grafting compound to treat a resist pattern. Embodiments of the new grafting compound include a grafting unit chemically bonded to a linking unit that is in turn chemically bonded to a polymer backbone. The grafting unit can be attached or bonded to the surface of the resist pattern to form a grafted layer, which effectively reduces the critical dimension of the resist pattern (e.g., an opening or a trench pattern). The linking unit is designed to be a linear or branched segment so as to keep a certain distance between the grafting unit and the polymer backbone. Due to the design of the linking unit, there is advantageously a large number of grafting units that can be attached to a unit area of the surface of the resist layer, thereby increasing the thickness of the grafted layer. The new grafting compound may be dissolved in a solvent and coated over the surface of the resist layer. A curing process causes a portion of the grafting compound to be attached to the surface of the resist layer to form the grafted layer. The unattached portions of the grafting compound is thereafter removed by a developer, resulting in a pattern (or an etch mask) having the resist layer and the grated layer. The details of the new grafting compound and the process of using it are further described below in conjunction with FIGS. 1-3.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, ion beam lithography, and other lithography processes. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims.

In the following discussion, the method 100 is described in conjunction with FIGS. 2A-2J wherein a semiconductor device 200 is fabricated by using embodiments of the method 100. The semiconductor device 200 may be an intermediate device fabricated during processing of an IC, or a portion thereof, that may comprise static random access memory (SRAM) and/or logic circuits, passive components such as resistors, capacitors, and inductors, and active components such as diodes, field-effect transistors (FETs), p-type FETs (PFETs), n-type FETs (NFETs), fin-like FETs (FinFETs), other three-dimensional (3D) FETs, metal-oxide-semiconductor FETs (MOSFET), complementary MOSFETs (CMOS), bipolar transistors, high voltage transistors, high frequency transistors, other memory cells, and combinations thereof.

Referring now to FIG. 1, the method 100 receives (or is provided with) a substrate 202 at operation 102. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In an alternative embodiment, the substrate 202 is a mask substrate that may include a low thermal expansion material such as quartz, silicon, silicon carbide, or silicon oxide-titanium oxide compound. To further this example, the substrate 202 may be a mask substrate for making a deep ultraviolet (DUV) mask, an extreme ultraviolet (EUV) mask, or other types of masks.

At operation 104, the method 100 (FIG. 1) forms a material layer 204 over the substrate 202 (FIG. 2B). In an embodiment, the material layer 204 is a hard mask layer including materials such as amorphous silicon (a-Si), silicon oxide, silicon nitride (SiN), titanium nitride, or other suitable material or composition. In an embodiment, the material layer 204 is an anti-reflection coating (ARC) layer such as a nitrogen-free anti-reflection coating (NFARC) layer including material(s) such as silicon oxygen carbide or plasma enhanced chemical vapor deposited silicon oxide. In various embodiments, the material layer 204 may include a high-k dielectric layer, a gate layer, a hard mask layer, an interfacial layer, a capping layer, a diffusion/barrier layer, a dielectric layer, a conductive layer, other suitable layers, and/or combinations thereof. The material layer 204 may be formed over the substrate 202 by one or more deposition techniques such as physical vapor deposition, chemical vapor deposition, and atomic layer deposition. In some embodiment, the substrate 202 includes a patterning layer (the patterning layer is to be etched with or otherwise patterned by a resist pattern) as its top layer and the method 100 may skip the operation 104 without forming the material layer 204.

At operation 106, the method 100 (FIG. 1) forms a photoresist (or resist) layer 206 over the substrate 202, and particularly over the material layer 204 in the present embodiment. Referring to FIG. 2C, in an embodiment, the resist layer 206 is formed by spin-on coating a liquid polymeric material over the material layer 204. In an embodiment, the resist layer 206 is further treated with a soft baking process and/or a hard baking process. In an embodiment, the resist layer 206 is sensitive to a radiation, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. The resist layer 206 may be a negative tone development (NTD) resist, i.e., its solubility in a developer decreases upon the radiation. An example of the NTD resist is a polymeric material including cross-linkable polymer and cross-linkers, where the polymer molecules cross-link upon radiation. Alternatively, the resist layer 206 may be a positive tone development (PTD) resist, i.e., its solubility in a developer increases upon the radiation. An example of the PTD resist is a chemically amplified resist (CAR) having one or more acid labile groups (ALG) and photo-acid generators (PAG) that produce an acid upon radiation. The acid cleaves the ALGs off the polymeric material in a chemical amplification reaction.

In an embodiment, the material layer 204 is also a polymeric material and is also spin-on coated onto the substrate 202. To further this embodiment, the material layer 204 and the resist layer 206 have different optical properties with respect to the radiation. For example, the material layer 204 may have a substantially different refractive index (n), extinction coefficient (k), or spectroscopic transmittance (T) than the resist layer 206.

At operation 108, the method 100 (FIG. 1) patterns the resist layer 206 to form a resist pattern having one or more openings therein. The operation 108 may include a variety of processes such as exposing, baking, and developing the resist layer 206, which are further described below.

Referring to FIG. 2D, the resist layer 206 is exposed to a radiation beam 208 in a lithography system. Some portions 206a (shaded areas) of the resist layer 206 are exposed by the radiation beam 208, and other portions 206b of the resist layer 206 remain unexposed. The radiation beam 208 may be an I-line light (365 nm), a DUV radiation such as KrF excimer laser (248 nm) or ArF excimer laser (193 nm), a EUV radiation (e.g., 13.5 nm), an e-beam, an x-ray, an ion beam, or other suitable radiations. Operation 108 may be performed in air, in a liquid (immersion lithography), or in a vacuum (e.g., for EUV lithography and e-beam lithography). In an embodiment, the radiation beam 208 is patterned with a mask 210, such as a transmissive mask or a reflective mask, which may include resolution enhancement techniques such as phase-shifting and/or optical proximity correction (OPC). The mask 210 includes various patterns for forming IC features in or on the substrate 202. In another embodiment, the radiation beam 208 is directly modulated with a predefined pattern, such as an IC layout, without using a mask (e.g., maskless lithography using e-beam). In an embodiment, the operation 108 includes baking the resist layer 206 after it has been exposed.

Figures 1, 2E:
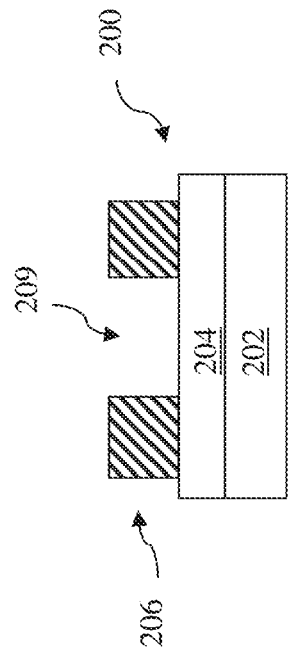
Figure 2F:
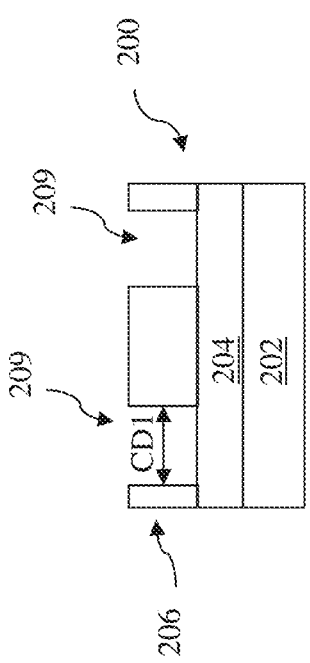
Figures 2, 2E:
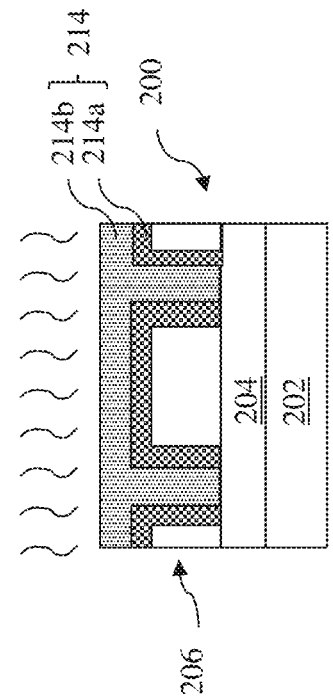
Figure 3:
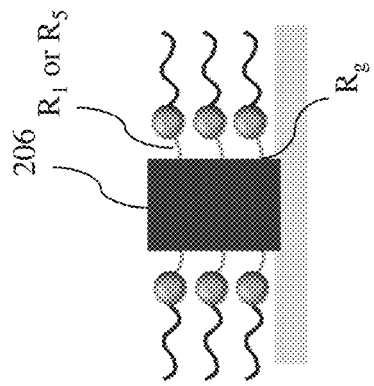
FIG. 3 illustrates a grafting compound attached to a photoresist layer, constructed according to aspects of the present disclosure.

Referring to FIGS. 2E-1 and 2E-2, the operation 108 develops the exposed resist layer 206 in a developer to form a resist pattern (also referred to as the resist pattern 206). The developer may include an aqueous solvent or an organic solvent. Depending on the type of the resist layer 206 and the developer, either the exposed portions 206a are removed (e.g., in a PTD process as shown in FIG. 2E-1), or the unexposed portions 206b are removed (e.g., in an NTD process as shown in FIG. 2E-2). In either case, one or more openings 209 are formed in the resist layer 206. The one or more openings 209 have a critical dimension CD1. In some embodiments, the critical dimension CD1 is greater than a desired dimension when the resist pattern 206 is used as an etch mask to etch the material layer 204, and optionally the substrate 202. In the present embodiment, the method 100 performs further operations to reduce the critical dimension in the pattern before using it as a mask in subsequent processes. For the convenience of discussion, the resist pattern 206 as shown in FIG. 2E-1 is used as an example for subsequent operations. Person having ordinary skill in the art should recognize that the resist pattern 206 as shown in FIG. 2E-2 can also be used for the subsequent operations.

At operation 110, the method 100 (FIG. 1) applies a grafting solution 214 over the resist pattern 206 and in the openings 209 (FIG. 2F). In the present embodiment, the operation 110 applies the grafting solution 214 by a spin-on coating process or other suitable methods. The grafting solution 214 includes a grafting compound and a solvent. The grafting compound comprises a grafting unit, a linking unit, and a polymer backbone, wherein the grafting unit is chemically bonded to the linking unit that is in turn chemically bonded to the polymer backbone. In the present embodiment, the grafting unit is not directly bonded to the polymer backbone. The grafting unit includes one or more reactive sites so that it can be attached or bonded to the surface of the resist pattern 206. The linking unit is designed to include a segment that provides a certain distance between the grafting unit and the polymer backbone. A purpose of the linking unit is to allow as many grafting units as possible to be attached to a unit area on the surface of the resist pattern 206. Therefore, certain length in the segment is desirable. If the segment is too short, the number of grafting units attached to the surface of the resist pattern 206 may be reduced due to the crowding of the polymer backbone. However, the length of the segment may not be so long that it may affect the grafting compound's floatability in a solvent. In an embodiment, the segment in the linking unit is an alkyl segment having 1 to 10 carbon atoms, such as an alkyl segment having 3 to 5 carbon atoms. The number of carbon atoms in the alkyl segment may be designed as discussed above. The alkyl segment is a linear alkyl segment in the present embodiment. Alternatively, the alkyl segment may be a branched alkyl segment.

The linking unit may further comprise one or more heteroatoms which help tune various properties of the grafting compound such as the strength of interaction with the resist pattern 206, the solubility of the grafting compound in a solvent, and so on. The one or more heteroatoms may include oxygen, nitrogen, or fluorine in some embodiments.

In some embodiments, the grafting compound may be represented as the formula (a) below:

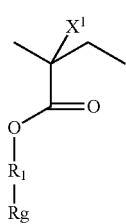

(a)

In the formula (a) above, Rg is the grafting unit; $R_1$ is the linking unit as discussed above; and X1 is hydrogen or methyl. R1 is bonded to the polymer backbone through at least an oxygen atom. In an embodiment, Rg comprises a monomer containing nitrogen. In a further embodiment, Rg comprises a primary amine, a secondary amine, or a tertiary amine.

In some embodiments, the grafting compound may be represented as the formula (b) below:

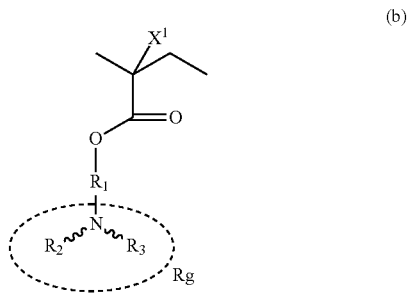

(b)

In the formula (b) above, $R_1$ is the linking unit as discussed above; X1 is hydrogen or methyl; and each of $R_2$ and $R_3$ is independently hydrogen, an alkyl group having 1 to 10 carbon atoms, or a cycloalkyl group. $R_1$ is bonded to the polymer backbone through at least an oxygen atom. In this embodiment, the grafting unit comprises $NR_2R_3$ as shown above, which is a specific example of the Rg in the formula (a).

In some embodiments, the grafting compound may be represented as the formula (c) below:

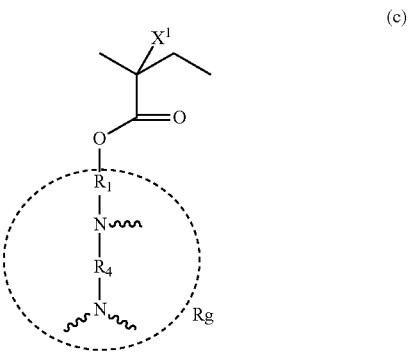

(c)

In the formula (c) above, $R_1$ is the linking unit as discussed above; X1 is hydrogen or methyl; and R4 is an alkyl group having 1 to 10 carbon atoms, or a cycloalkyl group. $R_1$ is bonded to the polymer backbone through at least an oxygen atom. In this embodiment, the grafting unit comprises $NR_4N$ as shown above, which is a specific example of the Rg in the formula (a).

In some embodiments, the grafting compound may be represented as the formula (d) below:

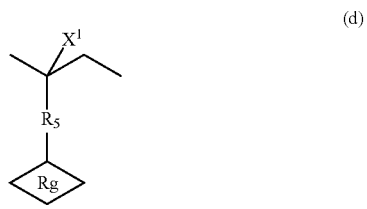

(d)

In the formula (d) above, $R_5$ is the linking unit as discussed above; X1 is hydrogen or methyl; and Rg is the grafting unit and comprises a heterocyclic group having 5 to 20 carbon atoms and one or more heteroatoms. In an embodiment, the one or more heteroatoms comprise nitrogen.

In some embodiments, the grafting compound may be represented as the formula (e) below:

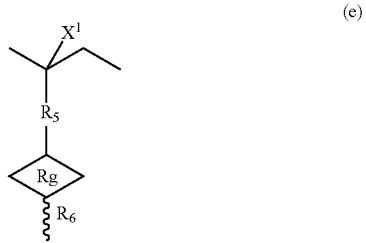

(e)

In the formula (e) above, $R_5$ is the linking unit as discussed above; X1 is hydrogen or methyl; and Rg is the grafting unit and comprises a heterocyclic group having 5 to 20 carbon atoms and one or more heteroatoms. The one or more heteroatoms comprise nitrogen in an embodiment. In this formula, the grafting compound further comprises $R_6$ attached to Rg. In an embodiment, $R_6$ is hydrogen, a linear alkyl segment with 1 to 6 carbon atoms, or a branched alkyl segment with 1 to 6 carbon atoms.

In some embodiments, the grafting compound may be represented as the formula (f) below:

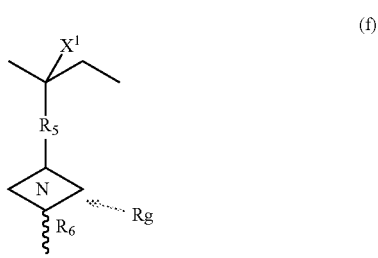

(f)

In the formula (f) above, $R_5$ is the linking unit as discussed above; X1 is hydrogen or methyl; and the grafting unit Rg comprises a heterocyclic group having 5 to 20 carbon atoms and one or more nitrogen atoms. This is a specific example of the Rg in the formula (e) above. In this formula, the grafting compound further comprises $R_6$ attached to the grafting unit which is bonded between $R_5$ and $R_6$. In an embodiment, $R_6$ is hydrogen, a linear alkyl segment with 1 to 6 carbon atoms, or a branched alkyl segment with 1 to 6 carbon atoms.

Still referring to FIG. 2F, the grafting solution 214 comprises the grafting compound dissolved in a solvent. The solvent may be water-based (aqueous) or organic, depending on the design of the various components in the grafting compound. Examples for the organic solvent include n-butyl acetate, 2-heptanone, Propylene glycol methyl ether acetate (PGMEA), Propylene glycol methyl ether (PGME), Propylene glycol 1-ethyl ether (PGEE), cyclohexanone (CHN), gamma-Butyrolactone (GBL), and methyl isobutyl carbinol (MIBC).

Figure 2G:
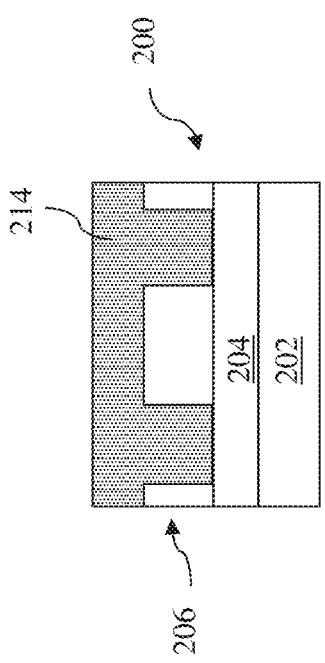
Figure 2I:
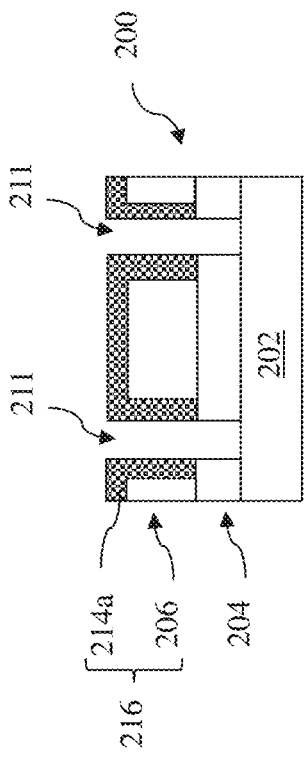

At operation 112, the method 100 (FIG. 1) cures the grafting solution 214. In an embodiment, the operation 112 includes baking the device 200 having the substrate 202, the material 204, the resist pattern 206, and the grafting solution 214. For example, the device 200 may be baked at a temperature ranging from room temperature (about 20 to 25° C.) to about 180° C. The baking temperature may be selected based on the properties of the resist pattern 206, as well as the properties of the substrate 202 and the material layer 204. The operation 112 may include other curing processes such as UV radiation in some embodiment. During the operation 112, a portion of the grafting compound is attached or become attached to the surface of the resist pattern 206 including the sidewalls of the openings 209. This is graphically illustrated in FIG. 3, where the grafting units Rg of the grafting compound react with the surface of the resist pattern 206, and thereby forming chemical bonds between them. The chemical bonds may include covalent bonds and/or ionic bonds. The linking units (e.g., R1 or R5) keep the polymer backbone of the grafting compound a certain distance away from the grafting units Rg so that a large number of grafting units Rg may be bonded per unit area on the surface of the resist pattern 206. This leads to a thick layer of grafting compound attached to the surface of the resist pattern 206, thereby forming a grafted layer 214a of the grafting compound (FIG. 2G). As shown in FIG. 2G, another portion 214b of the grafting compound is not attached to the surface of the resist pattern 206. Further, the solvent in the grafting solution 214 may be driven out by the operation 112. In an embodiment, the device 200 may be baked for duration ranging from a few seconds to a few hundred seconds, depending on some process requirements such as the thickness of the layer 214a. For example, longer baking duration may generally lead to a thicker layer 214a. Further, a higher baking temperature may generally lead to a thicker layer 214a.

Figure 2H:
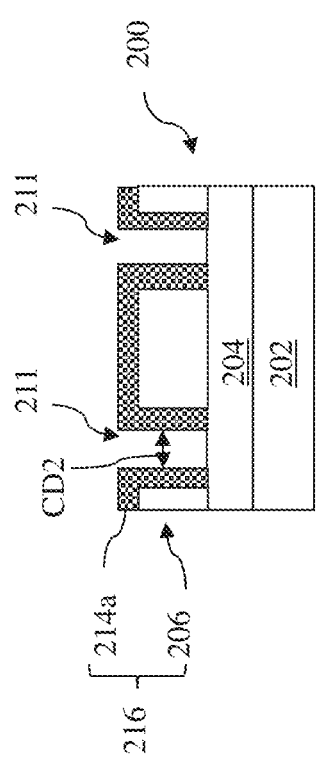

At operation 114, the method 100 (FIG. 1) removes the portion 214b of the grafting compound, leaving the layer 214a on the surface of the resist pattern 206 (FIG. 2H). In various embodiments, the operation 114 may apply a developer to remove the portion 214b. The developer may be de-ionized water (DIW) if the grafting compound is water-based or an organic solvent if the grafting compound is organic solvent based. Example organic solvent for the developer includes n-butyl acetate, 2-heptanone, PGMEA, PGME, PGEE, CHN, GBL, and MIBC. The developer for removing the portion 214b may be the same as or different from the solvent in the grafting solution 214. The developer does not remove (or insignificantly removes) the layer 214a.

As shown in FIG. 2H, portions of the layer 214a are attached to the sidewalls of the openings 209, thereby forming new openings 211 whose critical dimension CD2 is reduced from the critical dimension CD1 of the openings 209 (FIG. 2E-1) by twice the thickness of the layer 214a. This reduction in critical dimension is highly desirable for achieving smaller circuit features for the same photolithography tools. The thickness of the layer 214a may be controlled by designing the various components of the grafting compound, tuning the process parameters of the curing process such as baking temperature and baking duration, and/or designing the developer for removing the portion 214b. The layer 214a and the resist pattern 206 collectively become a pattern 216 for subsequent processes. For example, the pattern 216 may be used as an etch mask for etching layers thereunder, such as the material layer 204 and optionally the substrate 202. For another example, the pattern 216 may be used as a blocking mask for ion implantation or other desired semiconductor manufacturing processes.

In the example shown in FIGS. 2F-2H, the method 100 attaches a layer of the grafting compound to the resist pattern 206. However, person having ordinary skill in the art should recognize that the grafting solution 214 may also be applied to patterns comprising other polymeric materials instead of the resist pattern 206 so long as the grafting units Rg can be bonded to the polymeric materials. Therefore, the method 100 may be applied to reduce the critical dimension of patterns comprising other polymeric materials in addition to the resist pattern 206.

Figure 2J:
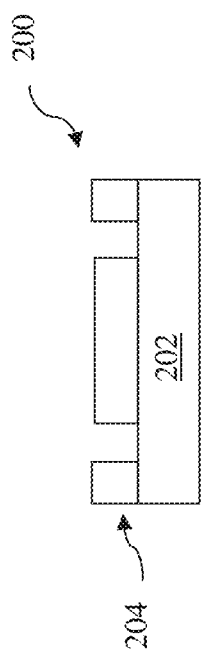

At operation 116, the method 100 (FIG. 1) etches the material layer 204 using the pattern 216 as an etching mask, thereby transferring the pattern to the material layer 204. In an embodiment, the operation 116 further etches the substrate 202 using the pattern 216 as an etch mask. The operation 116 may use a dry (plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The pattern 216 may be partially consumed during the etching of the material layer 204. In an embodiment, any remaining portion of the pattern 216 may be stripped off, leaving the patterned material layer 204 over the substrate 202, as illustrated in FIG. 2J.

Although not shown in FIG. 1, the method 100 may proceed to further processes in order to form a final pattern or device. For example, the method 100 may etch the substrate 202 with the patterned material layer 204 as an etch mask. For another example, the method 100 may deposit additional layer(s) above the patterned material layer 204 and perform patterning processes to the additional layer(s). For example, the method 100 may form shallow trench isolation (STI) features for defining transistor active regions, may form fin-like protrusions in the respective substrates for forming FinFETs, may form contact holes for transistor source/drain/gate contacts, and may form interconnect features.

Although not intended to be limiting, one or more embodiments of the present disclosure provide many benefits to semiconductor manufacturing processes. For example, a new grafting compound constructed according to embodiments of the present disclosure can be attached to a resist pattern to form a grafted layer, thereby reducing the critical dimension (CD) of the resist pattern. The design of the grafting compound allows a thick grated layer to be formed. Further, the design of the grafting compound and the associated curing and developing processes provide flexibility in controlling the reduction in the CD. Still further, the disclosed methods can be easily integrated into existing semiconductor manufacturing processes.

In one exemplary aspect, the present disclosure is directed to a method for lithography patterning. The method includes forming an opening in a first layer over a substrate and coating a grafting solution over the first layer and filling in the opening. The grafting solution comprises a grafting compound and a solvent. The grafting compound comprises a grafting unit chemically bonded to a linking unit chemically bonded to a polymer backbone. The linking unit comprises an alkyl segment. The grafting unit is attachable to the first layer. The method further includes curing the grafting solution so that the grafting compound is attached to a surface of the first layer, thereby forming a second layer over the surface of the first layer.

In another exemplary aspect, the present disclosure is directed to a method for lithography patterning. The method includes providing a patterned photoresist layer over a substrate, the patterned photoresist layer having an opening; and coating a grafting solution over the patterned photoresist layer and filling in the opening. The grafting solution comprises a grafting compound and a solvent. The grafting compound comprises a grafting unit chemically bonded to a linking unit chemically bonded to a polymer backbone. The linking unit comprises an alkyl segment. The grafting unit is attachable to the patterned photoresist layer. The method further includes baking the substrate, the patterned photoresist layer, and the grafting solution, thereby forming a second layer over a surface of the patterned photoresist layer by attaching a first portion of the grafting compound to the surface of the patterned photoresist layer. The method further includes removing a second portion of the grafting compound that is not attached to the patterned photoresist layer, resulting in a pattern having the patterned photoresist layer and the second layer, a portion of the second layer being on sidewalls of the opening.

In another exemplary aspect, the present disclosure is directed to a method for lithography patterning. The method includes forming a photoresist layer over a substrate; patterning the photoresist layer to have openings; and coating a grafting solution over the photoresist layer and filling in the openings. The grafting solution comprises a grafting compound and a solvent. The grafting compound comprises a grafting unit chemically bonded to a linking unit chemically bonded to a polymer backbone. The linking unit comprises an alkyl segment. The grafting unit is attachable to the photoresist layer. The method further includes curing the grafting solution so that a first portion of the grafting compound is attached to a surface of the photoresist layer including sidewalls of the openings. In the above method, the grafting compound is represented as one of formulas (a), (b), (c), (d), (e), and (f) above.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   forming an opening in a first layer over a substrate;
   coating a grafting solution over the first layer and filling in the opening, the grafting solution comprising a grafting compound and a solvent, the grafting compound comprising a grafting unit and a linking unit, the linking unit being chemically bonded to a polymer backbone through a carboxylic ester group, the grafting unit being attachable to the first layer and comprising a monomer containing a cycloalkyl group directly bonded to a plurality of nitrogen atoms, the grafting unit being chemically bonded to the linking unit by way of one of the plurality of nitrogen atoms;
   curing the grafting solution so that the grafting compound is attached to a surface of the first layer, thereby forming a second layer over the surface of the first layer; and
   transferring a pattern including the first layer and the second layer to the substrate.

2. The method of claim 1, wherein the first layer comprises a photoresist.

3. The method of claim 1, wherein the linking unit comprises a linear or branched alkyl segment having 3 to 5 carbon atoms.

4. The method of claim 1, wherein the grafting unit includes a heterocyclic group having 5 to 20 carbon atoms and nitrogen.

5. The method of claim 1, wherein the grafting unit is attached between a first element comprising an alkyl segment and a second element comprising hydrogen or a linear or branched alkyl segment with 1 to 6 carbon atoms.

6. The method of claim 1, wherein the curing of the grafting solution includes baking the substrate, the first layer, and the grafting solution at a temperature ranging from 20° C. to 180° C.

7. The method of claim 1, wherein the curing of the grafting solution includes irradiating the grafting solution with UV light.

8. The method of claim 1, wherein the carboxylic ester group attaches to the polymer backbone on a carboxylic carbon atom.

9. The method of claim 1, wherein one of the plurality of nitrogen atoms further attaches to the linking unit.

10. A method for lithography patterning, comprising:
providing a patterned photoresist layer over a material layer over a substrate, the patterned photoresist layer having an opening;
coating a grafting solution in the opening, the grafting solution comprising a grafting compound and a solvent, the grafting compound comprising a grafting unit and a linking unit that is chemically bonded to an ester side chain of a polymer backbone, the linking unit comprising an alkyl segment having 1 to 10 carbon atoms, the grafting unit being attachable to the patterned photoresist layer and comprising at least two heteroatoms bridged by a cycloalkyl group and immediately bonded to the cycloalkyl group, the at least two heteroatoms comprising a nitrogen atom and the grafting unit being chemically bonded to the linking unit by way of the nitrogen atom;
baking the grafting solution at a temperature ranging from 20° C. to 180° C., thereby forming a second layer over a surface of the patterned photoresist layer by attaching a first portion of the grafting compound to the surface of the patterned photoresist layer;
removing a second portion of the grafting compound that is not attached to the patterned photoresist layer, resulting in a pattern having the patterned photoresist layer and the second layer, a portion of the second layer being on sidewalls of the opening;
etching the material layer using the pattern as an etch mask; and
removing the pattern.

11. The method of claim 10, wherein the grafting compound is represented as formula (c) below:

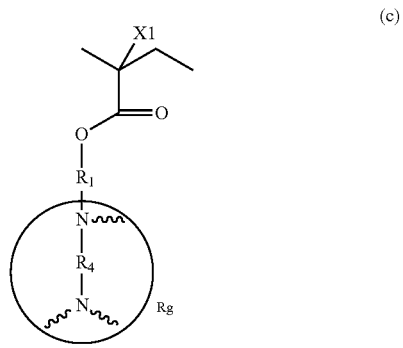

wherein $R_1$ is the linking unit and comprises an alkyl segment; X1 is hydrogen or methyl; R4 is an alkyl group having 1 to 10 carbon atoms, or a cycloalkyl group; and Rg is the grafting unit,
wherein the one of the at least two heteroatoms is bonded to an oxygen atom of the ester side chain.

12. The method of claim 10, wherein the alkyl segment in the linking unit is linear or branched.

13. The method of claim 10, wherein the alkyl segment in the linking unit includes 3 to 5 carbon atoms.

14. The method of claim 10, wherein the baking of the grafting solution includes:
selecting the temperature and duration for the baking of the grafting solution based on a target thickness of the second layer.

15. The method of claim 10, wherein the at least two heteroatoms are nitrogen (N) atoms.

16. A method for lithography patterning, comprising:
providing a patterned photoresist layer over a material layer over a substrate, the patterned photoresist layer having an opening;
coating a grafting solution in the opening, the grafting solution comprising a grafting compound and a solvent, the grafting compound comprising a grafting unit and a linking unit that is chemically bonded to a polymer backbone, the linking unit comprising an alkyl segment having 1 to 10 carbon atoms, the grafting unit comprising a cycloalkyl group directly bonded to and between two nitrogen (N) atoms, the grafting unit being chemically bonded to the linking unit by way of one of the two nitrogen (N) atoms, and the grafting unit being attachable to the patterned photoresist layer;
baking the grafting solution at a first temperature for a duration, thereby attaching a first portion of the grafting compound to the patterned photoresist layer, wherein the first temperature and the duration are selected based on a target thickness of the first portion of the grafting compound;
removing a second portion of the grafting compound that is not attached to the patterned photoresist layer, resulting in a pattern having the patterned photoresist layer and the first portion of the grafting compound; and
etching the material layer using the pattern as an etch mask.

17. The method of claim 16, wherein the alkyl segment in the linking unit includes 3 to 5 carbon atoms.

18. The method of claim 16, wherein the grafting unit includes a heterocyclic group having 5 to 20 carbon atoms, a monomer containing nitrogen, or a heterocyclic group having 5 to 20 carbon atoms and nitrogen.

19. The method of claim 16, wherein the first temperature is in a range from 20° C. to 180° C., and the duration is in a range from a few seconds to a few hundred seconds.

20. The method of claim 16, wherein the grafting compound further includes a carboxylic ester group having a carbonyl and a hydroxy oxygen bonded to the carbonyl, the carbonyl directly attached to the polymer backbone, and the hydroxy oxygen directly attached to the linking unit.

* * * * *